US012640205B2

(12) United States Patent
Zhu

(10) Patent No.: US 12,640,205 B2
(45) Date of Patent: May 26, 2026

(54) MEMORY AND MULTI-INITIALIZATION OPERATION OPERATING METHOD THEREOF, MEMORY SYSTEM AND READABLE STORAGE MEDIUM

(71) Applicant: YANGTZE MEMORY TECHNOLOGIES CO., LTD., Wuhan (CN)

(72) Inventor: Zhijiu Zhu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 175 days.

(21) Appl. No.: 18/540,350

(22) Filed: Dec. 14, 2023

(65) Prior Publication Data

US 2025/0061946 A1     Feb. 20, 2025

(30) Foreign Application Priority Data

Aug. 14, 2023     (CN) .......................... 202311030962.7

(51) Int. Cl.
| | |
|---|---|
| *G11C 7/22* | (2006.01) |
| *G11C 16/08* | (2006.01) |
| *G11C 16/10* | (2006.01) |
| *G11C 16/20* | (2006.01) |
| *G11C 16/32* | (2006.01) |

(52) U.S. Cl.
CPC ............ *G11C 16/102* (2013.01); *G11C 16/08* (2013.01); *G11C 16/20* (2013.01); *G11C 16/32* (2013.01)

(58) Field of Classification Search
CPC ....... G11C 16/102; G11C 16/08; G11C 16/20; G11C 16/32; G11C 7/20; G11C 7/22; G11C 16/0483; G11C 16/10
USPC ..................................................... 365/189.011
See application file for complete search history.

(56) References Cited

U.S. PATENT DOCUMENTS

| | | | | |
|---|---|---|---|---|
| 7,986,557 B2 * | 7/2011 | Tokiwa | .................... | G11C 8/06 |
| | | | | 365/185.17 |
| 2002/0015328 A1 * | 2/2002 | Dono | ................. | G11C 16/0441 |
| | | | | 365/185.08 |

* cited by examiner

*Primary Examiner* — Tha-O H Bui
(74) *Attorney, Agent, or Firm* — Conley Rose, P.C.

(57)     ABSTRACT

An example memory includes an array of memory cells and a peripheral circuit coupled to the array of memory cells; the peripheral circuit is configured to: receive a program command, a program address, program data, and a program confirmation command which correspond to a program operation, and perform the program operation on the array of memory cells after performing at least two initialization operations. The process of receiving the program command, the program address, the program data, and the program confirmation command which correspond to the program operation and the process of performing the at least two initialization operations at least partially overlap in time.

20 Claims, 11 Drawing Sheets

S1101

RECEIVE A PROGRAM COMMAND, A PROGRAM ADDRESS, PROGRAM DATA, AND A PROGRAM CONFIRMATION COMMAND CORRESPONDING TO A PROGRAM OPERATION

S1102

AFTER PERFORMING AT LEAST TWO INITIALIZATION OPERATIONS, PERFORM THE PROGRAM OPERATION ON THE ARRAY OF MEMORY CELLS; WHEREIN, THE PROCESS OF RECEIVING THE PROGRAM COMMAND, THE PROGRAM ADDRESS, THE PROGRAM DATA, AND THE PROGRAM CONFIRMATION COMMAND CORRESPONDING TO THE PROGRAM OPERATION AND THE PROCESS OF PERFORMING THE AT LEAST TWO INITIALIZATION OPERATIONS AT LEAST PARTIALLY OVERLAP IN TIME

MEMORY AND MULTI-INITIALIZATION OPERATION OPERATING METHOD THEREOF, MEMORY SYSTEM AND READABLE STORAGE MEDIUM

CROSS-REFERENCE TO RELATED APPLICATIONS

The present application claims priority Chinese Patent Application No. 2023110309627, which was filed Aug. 14, 2023, is titled "A MEMORY AND ITS OPERATING METHOD, MEMORY SYSTEM AND READABLE STORAGE MEDIUM," and is hereby incorporated herein by reference in its entirety.

TECHNICAL FIELD

An example of the present disclosure relates to the field of semiconductor technology, and in particular to a memory and operating method thereof, a memory system and a readable storage medium.

BACKGROUND

With the continuous development of semiconductor technology, the current memory manufacturing technology has gradually transitioned from a simple planar structure to a more complex three-dimensional structure, and the integration density is increased through three-dimensional arrangement of memory cells on the substrate. However, initialization operations are to be completed before performing a program operation on the memory, and these initialization operations will occupy program time, thus affecting program performance.

SUMMARY

Examples of the present disclosure provide a memory and operating method thereof, a memory system and a readable storage medium.

In a first aspect, an example of the present disclosure provides a memory, wherein the memory includes an array of memory cells and a peripheral circuit coupled to the array of memory cells; the peripheral circuit is configured to: receive a program command, a program address, program data, and a program confirmation command which correspond to a program operation; and perform the program operation on the array of memory cells after performing at least two initialization operations; wherein, the process of receiving the program command, the program address, the program data, and the program confirmation command corresponding to the program operation and the process of performing the at least two initialization operations at least partially overlap in time.

In some examples, in the case of performing three initialization operations, the three initialization operations include a first initialization operation, a second initialization operation and a third initialization operation, and the first initialization operation is unrelated to the program address and the program data which correspond to the program operation; the peripheral circuit includes an interface circuit and a microcontroller unit, and the interface circuit includes a first signal generating circuit, a second signal generating circuit and a third signal generating circuit; the interface circuit is configured to: receive a program command and a program address which correspond to a program operation; the first signal generating circuit is configured to: send a first initialization operation signal to the microcontroller unit after the interface circuit receiving a program command corresponding to a program operation; the microcontroller unit is configured to: receive the first initialization operation signal, and perform a first initialization operation; wherein, the process of receiving the program address corresponding to the program operation and the process of performing the first initialization operation are performed in parallel.

In some examples, the second initialization operation is related to the program address corresponding to the program operation and unrelated to the program data corresponding to the program operation; the interface circuit is further configured to: receive a program address and program data which correspond to a program operation; the second signal generating circuit is configured to: send a second initialization operation signal to the microcontroller unit after the interface circuit receiving a program address corresponding to a program operation; the microcontroller unit is further configured to: receive the second initialization operation signal, and perform a second initialization operation; wherein, the process of receiving the program data corresponding to the program operation and the process of performing the second initialization operation are performed in parallel.

In some examples, the first initialization operation includes a temperature detection operation; the second initialization operation includes a word line voltage bias operation and a bad block detection operation.

In some examples, the third initialization operation is related to the program data corresponding to the program operation;

the interface circuit is further configured to: receive program data and a program confirmation command which correspond to the program operation;

the third signal generating circuit is configured to: send a third initialization operation signal to the microcontroller unit after the interface circuit receiving a program confirmation command; the microcontroller unit is further configured to: receive the third initialization operation signal, and perform a third initialization operation.

In some examples, the microcontroller unit includes a clock signal circuit; the clock signal circuit is configured to output a transition of the clock signal during each of the processes of performing the first initialization operation, the second initialization operation and the third initialization operation by the microcontroller unit.

In some examples, in the case of performing two initialization operations, the two initialization operations include a fourth initialization operation and a third initialization operation, and the fourth initialization operation is unrelated to the program data corresponding to the program operation; the peripheral circuit includes an interface circuit and a microcontroller unit, and the interface circuit includes a fourth signal generating circuit and a third signal generating circuit; the interface circuit is configured to: receive a program command, a program address and program data which correspond to a program operation; the fourth signal generating circuit is configured to: send a fourth initialization operation signal to the microcontroller unit after the interface circuit receiving a program address corresponding to a program operation; the microcontroller unit is configured to: receive a fourth initialization operation signal, and perform a fourth initialization operation; wherein, the process of receiving the program data corresponding to the program operation and the process of performing the fourth initialization operation are performed in parallel.

In some examples, the fourth initialization operation includes a temperature detection operation, a word line voltage bias operation and a bad block detection operation.

In some examples, the third initialization operation is related to the program data corresponding to the program operation; the interface circuit is further configured to: receive program data and a program confirmation command which correspond to the program operation; the third signal generating circuit is configured to: send a third initialization operation signal to the microcontroller unit after the interface circuit receiving a program confirmation command; the microcontroller unit is further configured to: receive the third initialization operation signal, and perform a third initialization operation.

In some examples, the microcontroller unit includes a clock signal circuit; the clock signal circuit is configured to output a transition of the clock signal during each of the processes of performing the fourth initialization operation and the third initialization operation by the microcontroller unit.

In a second aspect, an example of the present disclosure provides a memory system, the memory system includes: at least one memory in the solution described above; and a controller, which is coupled to the memory and configured to control the memory.

In a third aspect, an example of the present disclosure provides an method for operating a memory, wherein the memory includes an array of memory cells and a peripheral circuit coupled to the array of memory cells; the method includes: receiving a program command, a program address, program data, and a program confirmation command which correspond to a program operation; performing the program operation on the array of memory cells after performing at least two initialization operations; wherein, the process of receiving the program command, the program address, the program data, and the program confirmation command which correspond to the program operation and the process of performing the at least two initialization operations at least partially overlap in time.

In some examples, in the case of performing three initialization operations, the three initialization operations include a first initialization operation, a second initialization operation and a third initialization operation, and the first initialization operation is unrelated to the program address and the program data which correspond to the program operation; the peripheral circuit includes an interface circuit and a microcontroller unit, and the interface circuit includes a first signal generating circuit, a second signal generating circuit and a third signal generating circuit; the method includes: the interface circuit receiving a program command corresponding to a program operation; the first signal generating circuit sending a first initialization operation signal to the microcontroller unit after the interface circuit receiving a program command corresponding to a program operation; the microcontroller unit receiving the first initialization operation signal, and performing a first initialization operation; wherein, the process of receiving the program address corresponding to the program operation and the process of performing the first initialization operation are performed in parallel.

In some examples, the second initialization operation is related to the program address corresponding to the program operation and unrelated to the program data corresponding to the program operation; after the interface circuit receiving a program command corresponding to a program operation, the method further includes: the interface circuit receiving a program address corresponding to a program operation; the second signal generating circuit sending a second initialization operation signal to the microcontroller unit after the interface circuit receiving a program address corresponding to a program operation; the microcontroller unit receiving the second initialization operation signal, and performing a second initialization operation; wherein, the process of receiving the program data corresponding to the program operation and the process of performing the second initialization operation are performed in parallel.

In some examples, the third initialization operation is related to the program data corresponding to the program operation; after the interface circuit receiving a program address corresponding to a program operation, the method further includes: the interface circuit receiving program data and a program confirmation command which correspond to the program operation; the third signal generating circuit sending a third initialization operation signal to the microcontroller unit after the interface circuit receiving a program confirmation command; the microcontroller unit further receiving the third initialization operation signal, and performing a third initialization operation.

In some examples, the microcontroller unit includes a clock signal circuit; the method further includes: the clock signal circuit outputting a transition of the clock signal during each of the processes of performing the first initialization operation, the second initialization operation and the third initialization operation by the microcontroller unit.

In some examples, in the case of performing two initialization operations, the two initialization operations include a fourth initialization operation and a third initialization operation, and the fourth initialization operation is unrelated to the program data corresponding to the program operation; the peripheral circuit includes an interface circuit and a microcontroller unit, and the interface circuit includes a fourth signal generating circuit and a third signal generating circuit; the method further includes: the interface circuit receiving a program command and a program address which correspond to a program operation; the fourth signal generating circuit sending a fourth initialization operation signal to the microcontroller unit after the interface circuit receiving a program address corresponding to a program operation; the microcontroller unit receiving a fourth initialization operation signal, and performing a fourth initialization operation; wherein, the process of receiving the program data corresponding to the program operation and the process of performing the fourth initialization operation are performed in parallel.

In some examples, the third initialization operation is related to the program data corresponding to the program operation; after the interface circuit receiving a program command and a program address which correspond to a program operation, the method further includes: the interface circuit further receiving program data and a program confirmation command which correspond to the program operation; the third signal generating circuit sending a third initialization operation signal to the microcontroller unit after the interface circuit receiving a program confirmation command; the microcontroller unit receiving the third initialization operation signal, and performing a third initialization operation.

In some examples, the microcontroller unit includes a clock signal circuit; the method further includes: the clock signal circuit outputting a transition of the clock signal during each of the processes of performing the fourth initialization operation and the third initialization operation by the microcontroller unit.

In a fourth aspect, an example of the present disclosure provides a readable storage medium, the readable storage medium stores computer program that, when executed, may implement the method for operating a memory of any one of the technical schemes described above.

Examples of the present disclosure provide a memory and operating method thereof, a memory system and a readable storage medium. The memory includes an array of memory cells and a peripheral circuit coupled to the array of memory cells; the peripheral circuit is configured to: receive a program command, a program address, program data, and a program confirmation command which correspond to a program operation; and perform the program operation on the array of memory cells after performing at least two initialization operations; wherein, the process of receiving the program command, the program address, the program data, and the program confirmation command which correspond to the program operation and the process of performing the at least two initialization operations at least partially overlap in time. Compared with performing the initialization operation after receiving the program command, program address, the program data and the program confirmation command which correspond to the program operation, in an example of the present disclosure, the process of receiving the program command, the program address, the program data and the program confirmation command which correspond to the program operation and the process of performing at least two initialization operations at least partially overlap in time, for example, the process of receiving the program command, the program address, the program data and the program confirmation command which correspond to the program operation and the process of performing part of the initialization operation may be performed in parallel, in this way, the impact of the initialization operation on the program time may be improved, thereby program performance is improved.

BRIEF DESCRIPTION OF THE DRAWINGS

FIG. 11 is a flowchart of a method for operating a memory provided by an example of the present disclosure.

DETAILED DESCRIPTION

Figure 1:
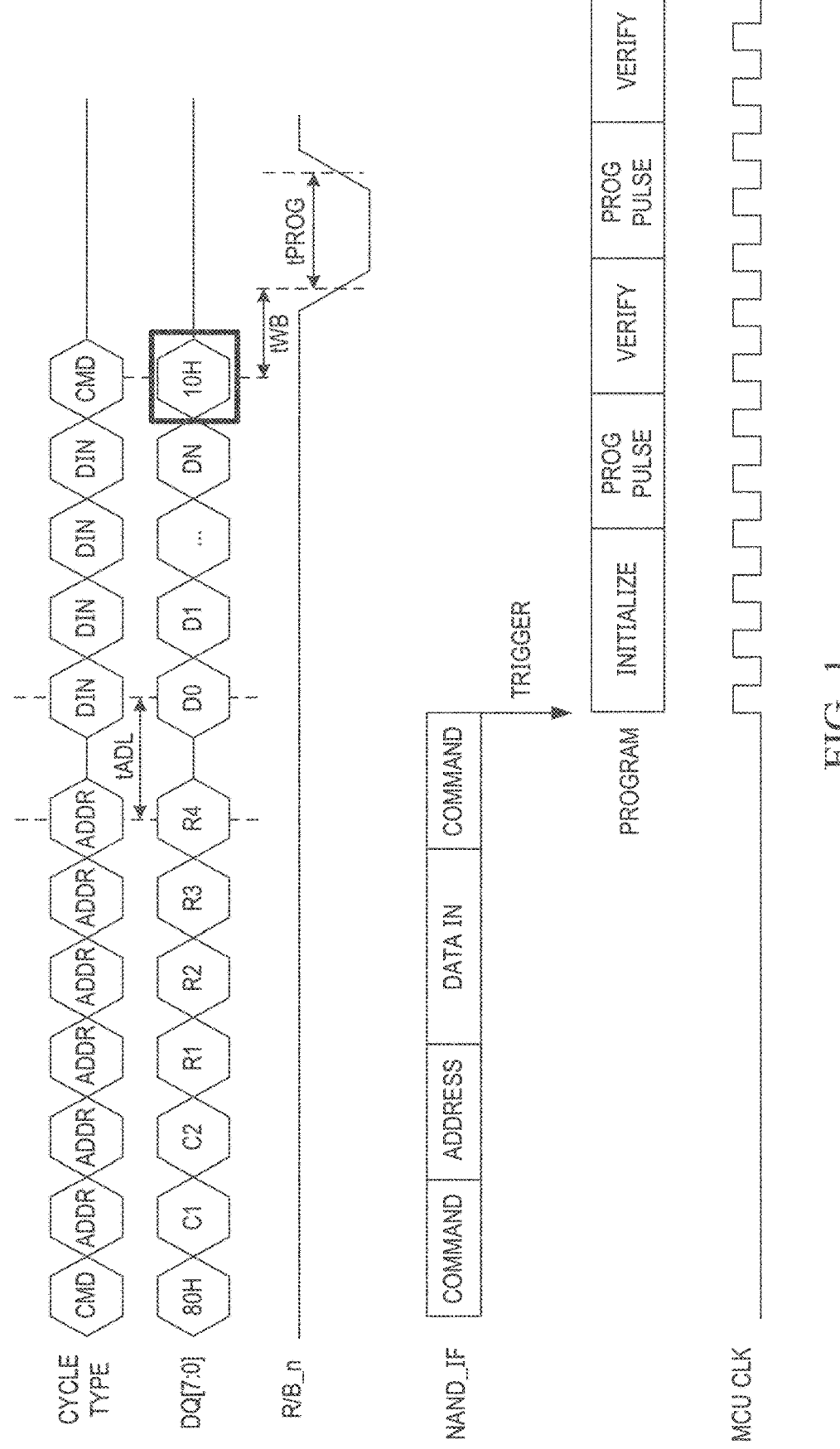
FIG. 1 is a timing diagram of a method for operating a memory provided by an example.

Examples of the present disclosure are described below in conjunction with the accompanying drawings. The described examples are only some, not all examples of the present disclosure. All other examples obtained by those skilled in the art based on the examples in the present disclosure without making creative efforts belong to the claimed scope of the present disclosure.

In the following description, numerous specific details are given to provide a more thorough understanding of the present disclosure. However, the present disclosure may be practiced without one or more of these details. In other examples, to avoid confusion with the present disclosure, some technical features known in the art are not described. For example, not all features of the actual example are described here, and well-known functions and structures are not described in detail.

In the accompanying drawings, size of a layer, a region, an element and their relative sizes may be exaggerated for clarity. Like reference numerals refer to like elements throughout.

In order to understand the present disclosure, detailed operations and detailed structures will be provided in the following description, so as to explain the technical solution of the present disclosure. Examples of the present disclosure are described in detail as follows. However, the present disclosure may have other examples other than these detailed descriptions.

During the program operation of memory (e.g., NAND type memory), initialization operations such as word line voltage bias, bad block detection, temperature detection, and calculation of related voltage and timing parameters, etc., need to be completed before program voltage is applied to memory cells. Since these initialization operations are necessary to implement the program voltage waveform and need to be completed before the program voltage is applied, the program time occupied by these initialization operations is challenging to eliminate, thus the program performance may be affected.

Referring to FIG. 1, FIG. 1 is a timing diagram of a method for operating a memory provided by an example. As shown in FIG. 1, during the program operation of the memory, the input type (Cycle Type) includes a program command (Command, CMD), a program address (Address, ADDR), program data (Data in, DIN) and a program confirmation command (CMD). Accordingly, the pin DQ[7:0] of the memory chip with input/output function receives a program command (e.g., 80h), a program address (including column address C1 and C2, row address R1, R2, R3 and R4), program data (including D0 to Dn) and a program confirmation command (e.g., 10h) in sequence. The pin R/B_n of the chip for monitoring the state of the memory chip includes a low level state and a high level state, wherein the low level state indicates that the memory chip is in a busy state. FIG. 1 also shows the time interval between inputting a program address and inputting program data (Address Cycle to Data Loading time, tADL), the time interval between receiving a program confirmation command and pulling R/B_n down to low level (e.g., tWB) and program operation time (e.g., tPROG).

As shown in FIG. 1, a memory (e.g., a NAND type memory) includes an array of memory cells and a peripheral circuit coupled to the array of memory cells, wherein the peripheral circuit includes an interface circuit (e.g., NAND Interface, or NAND_IF) and a Microcontroller Unit (MCU). The interface circuit receives the program command (e.g., command), the program address (e.g., address) and the program data (e.g., data in) in sequence, and analyzes the program command and program address. The interface circuit triggers the microcontroller unit to perform the firmware for the program algorithm after receiving the program confirmation command, so as to perform a program operation for the array of memory cells. The firmware for the program algorithm performs the initialization operation after being triggered, and the initialization operation includes the operations of word line voltage bias, bad block detection, temperature detection and calculation of related voltage and timing parameters, as well as processing related to user program data, e.g., data preprocessing, data transmission, etc. The program operation is started after the initialization operation is completed, and the program pulse (e.g., prog pulse)/verification (e.g., verify) are performed sequentially according to the Increment Operation Pulse Program (ISPP) principle until all memory cells reach the target threshold voltage required for the program state.

As seen from the above analyzation, in the example of FIG. 1, an initialization operation is performed after receiving the program command, the program address, the program data and the program confirmation command which correspond to the program operation, and the program-verify operation may only be performed after the initialization operation is completed. In this way, the program time occupied by the initialization operation is challenging to eliminate, thereby the program performance may be affected.

In view of this, examples of the present disclosure provide a memory and operating method thereof, a memory system and a readable storage medium.

Figure 2:
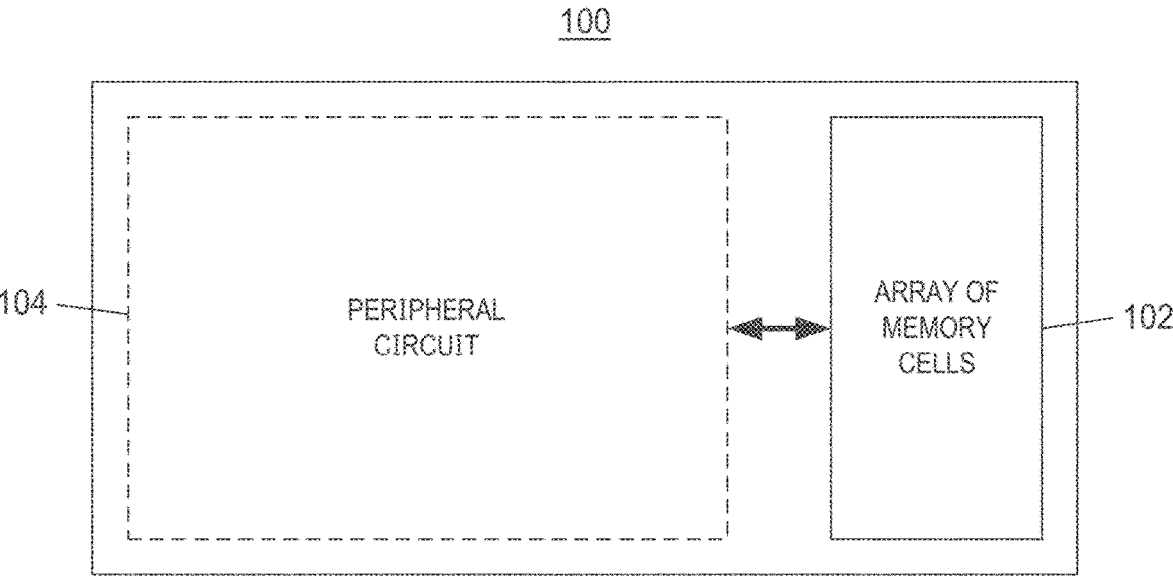
FIG. 2 is a first schematic diagram of a memory provided by an example of the present disclosure.

Referring to FIG. 2, FIG. 2 is a first schematic diagram of a memory provided by an example of the present disclosure. As shown in FIG. 2, an example of the present disclosure provides a memory 100. The memory 100 includes an array of memory cells 102 and a peripheral circuit 104 coupled to the array of memory cells 102. The peripheral circuit 104 is configured to: receive a program command, a program address, program data, and a program confirmation command which correspond to a program operation; and perform the program operation on the array of memory cells 102 after performing at least two initialization operations. The process of receiving the program command, the program address, the program data, and the program confirmation command which correspond to the program operation and the process of performing the at least two initialization operations at least partially overlap in time.

In an example of the present disclosure, the process of receiving the program command, the program address, the program data and the program confirmation command which correspond to the program operation and the process of performing at least two initialization operations at least partially overlap in time. For example, the process of receiving the program command, the program address, the program data and the program confirmation command which correspond to the program operation and the process of performing part of the initialization operation are performed in parallel. In this way, the impact of the initialization operation on the program time may be improved, thereby program performance is improved.

In one example, the array of memory cells 102 may be programmed after three initialization operations. The three initialization operations may include the first initialization operation, the second initialization operation and the third initialization operation, wherein, the process of receiving the program command, the program address, the program data and the program confirmation command which correspond to the program operation and the process of performing the first initialization operation and the second initialization operation at least partially overlap in time. For example, the process of receiving the program command, the program address, the program data and the program confirmation command which correspond to the program operation and the process of performing the first initialization operation and the second initialization operation are performed in parallel. In this way, the impact of the initialization operation on the program time may be improved, thereby the program performance is improved.

In one example, the array of memory cells 102 may be programmed after two initialization operations. The two initialization operations include the fourth initialization operation and the third initialization operation, wherein, the process of receiving the program command, the program address, the program data and the program confirmation command which correspond to the program operation and the process of performing the fourth initialization operation at least partially overlap in time. For example, the process of receiving the program command, the program address, the program data and the program confirmation command which correspond to the program operation and the process of performing the fourth initialization operation are performed in parallel. In this way, the impact of the initialization operation on the program time may be improved, thereby the program performance is improved.

Figure 3:
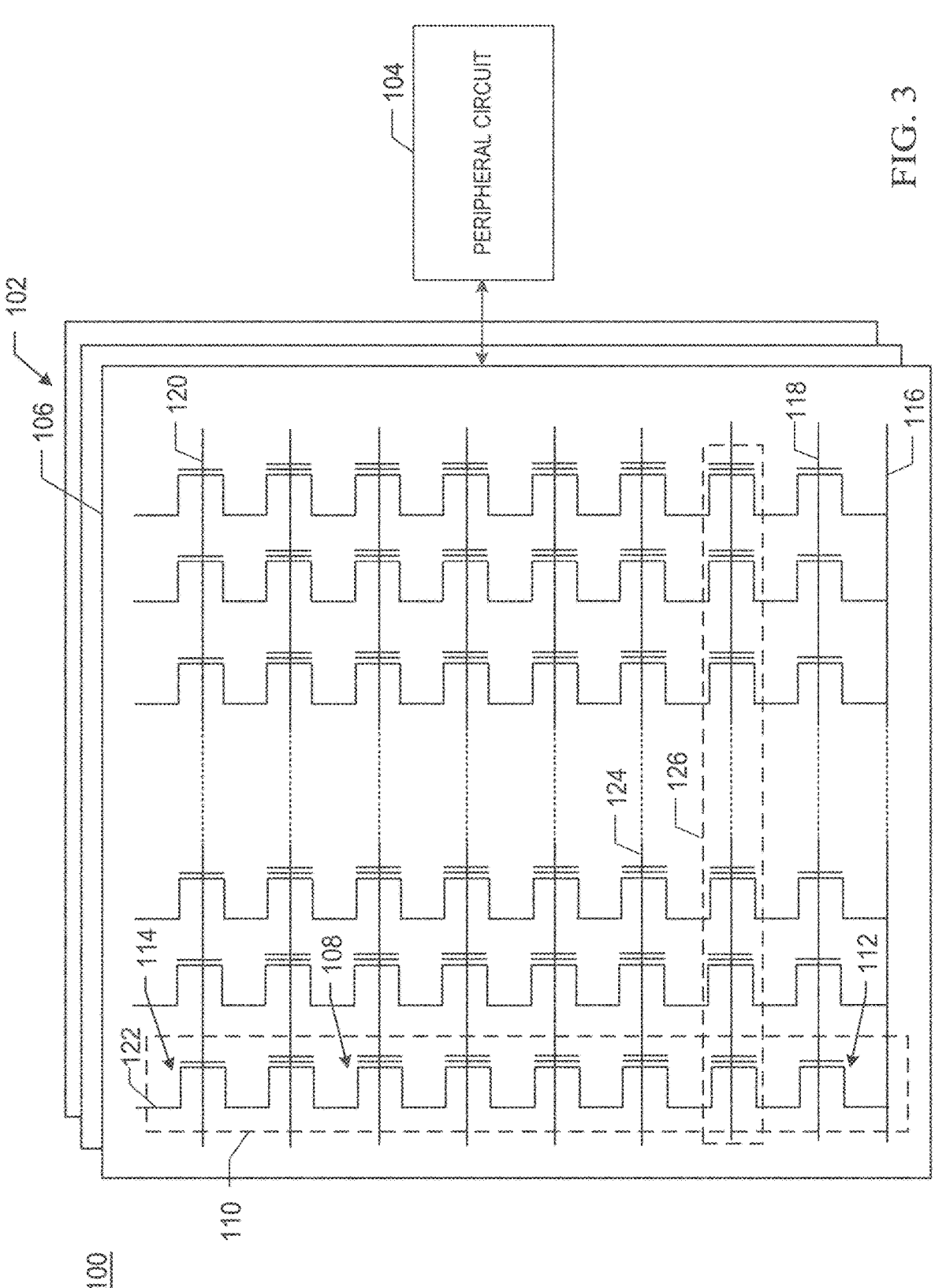
FIG. 3 is a schematic diagram of a memory including an array of memory cells provided by an example of the present disclosure.

Referring to FIG. 3, FIG. 3 is a schematic diagram of a memory including an array of memory cells provided by an example of the present disclosure. As shown in FIG. 3, memory 100 may include an array of memory cells 102 and a peripheral circuit 104 coupled to the array of memory cells 102. The array of memory cells 102 may comprise a NAND flash array of memory cells in which a memory cell 108 is provided in an array of memory strings 110, each of which extends vertically over a substrate (not shown in FIG. 3). In some examples, each memory string 110 includes multiple memory cells 108 coupled in series and stacked vertically. Each memory cell 108 may retain a continuous analog value, e.g., voltage or charge, depending on the number of electrons trapped within the area of the memory cell 108. Each memory cell 108 may comprise a memory cell of "floating gate" type which includes a floating gate transistor, or a memory cell of "charge trap" type which includes a charge trap transistor.

In some examples, each memory cell 108 may comprise a Single-Level Cell (SLC) that has two possible storage states and may thus store one bit of data. For example, an SLC may have a first storage state "1" and a second storage state "0", where the threshold voltage distribution of the first storage state "1" may correspond to a first voltage range and the threshold voltage distribution of the second storage state "0" may correspond to a second voltage range. In some examples, the first storage state may be an erase state, and the second storage state may be a program state. In some examples, each memory cell 108 comprise a Multi-Level Cell (MLC) which may store more than a single bit of data in more than four storage states. For example, an MLC may store two bits of data per cell, three bits of data per cell (also known as a Triple-Level Cell (TLC)), or four bits of data per cell (also known as a Quad-Level Cell (QLC)). Each MLC may be programmed to take a voltage range for a possible threshold voltage distribution. In an example, if each MLC stores two bits of data, the MLC may have a first storage state "11", a second storage state "10", a third storage state "01" and a fourth storage state "00", here, the threshold voltage distributions of the first, second, third and fourth storage state may correspond to the first, second, third and fourth voltage range, respectively. In some examples, the first storage state may be an erase state, and all of the second, third and fourth storage states may be program states. Similarly, TLC may have 8 storage states, including an erase state and 7 program states. QLC may have 16 storage states, including an erase state and 15 program states.

As shown in FIG. 3, each memory string 110 may include a Source Selective Transistor (SSG) 112 at its source terminal and a Drain Selective Transistor (DSG) 114 at its drain terminal. Source selective transistor 112 and drain selective transistor 114 may be configured to activate the selected memory string 110 (a column of the array) during read operation and program operation. In some examples, sources of the memory string 110 in a same memory block 106 are coupled through a same Source Line (SL) 116 (e.g., a common SL). In some examples, all memory strings 110 in a same memory block 106 have an Array Common Source (ACS). In some examples, the drain of the drain selective transistor 114 of each memory string 110 is coupled to a corresponding Bit Line (BL) 122 from which data may be read or written via an output bus (not shown in FIG. 3). In some examples, each memory string 110 is configured to be selected or deselected through applying a select voltage (e.g., above the threshold voltage of the Drain Selective Transistor 114) or a deselect voltage (e.g., 0V) to the corresponding Drain Selective Transistor 114 via one or more Drain Selective Lines 120 (DSL) and/or applying a select voltage (e.g., above the threshold voltage of the Source Selective Transistor 112) or a deselect voltage (e.g., 0V) to the corresponding Source Selective Transistor 112 via one or more Source Selective Lines (SSL) 118.

As also shown in FIG. 3, the memory string 110 may be organized into multiple memory blocks 106, each of which may have a source line 116 (e.g., a common SL coupled to ground). In some examples, each memory block 106 is the basic unit for an erase operation, e.g., all memory cells 108 on the same memory block 106 are erased simultaneously. To erase the memory cell 108 in the selected memory block 106, source line 116 which is coupled to selected memory block 106 and to unselected memory blocks 106 in the same plane as selected memory block 106 may be biased with an erase voltage Vers (e.g., a high positive voltage (e.g., 20V or higher)). In some examples, an erase operation may be performed at the half-block level, at the quarter-block level, or at a level with any suitable number of blocks or any suitable fraction of blocks. Memory cells 108 of adjacent memory strings 110 may be coupled through a word line 124 that selects which row of memory cells 108 is affected by read and program operations. In some examples, each word line 124 is coupled to a page 126 of memory cell 108. Each word line 124 may include multiple control gates (e.g., gate electrodes) at each memory cell 108 in a corresponding page 126 and a gate line coupling the control gates.

The memory page shown in FIG. 3 is a physical page, which refers to a layer of memory cells in physical aspect. The basic data unit for a program operation and a read operation is a logical page. For SLC, each memory cell may store 1 bit of information, so that in physical aspect, the information stored in a layer of memory cells (e.g., 1 physical page) corresponds to the information of 1 logical page. For MLC, each memory cell may store 1 bit of information, so that in physical aspect, the information stored in a layer of memory cells (e.g., 1 physical page) corresponds to the information of 2 logical pages. For TLC, each memory cell may store 1 bit of information, so that in physical aspect, the information stored in a layer of memory cells (e.g., 1 physical page) corresponds to the information of 3 logical pages. For QLC, each memory cell may store 1 bit of information, so that on in physical aspect, the information stored in a layer of memory cells (e.g., 1 physical page) corresponds to the information of 4 logical pages.

Figure 4:
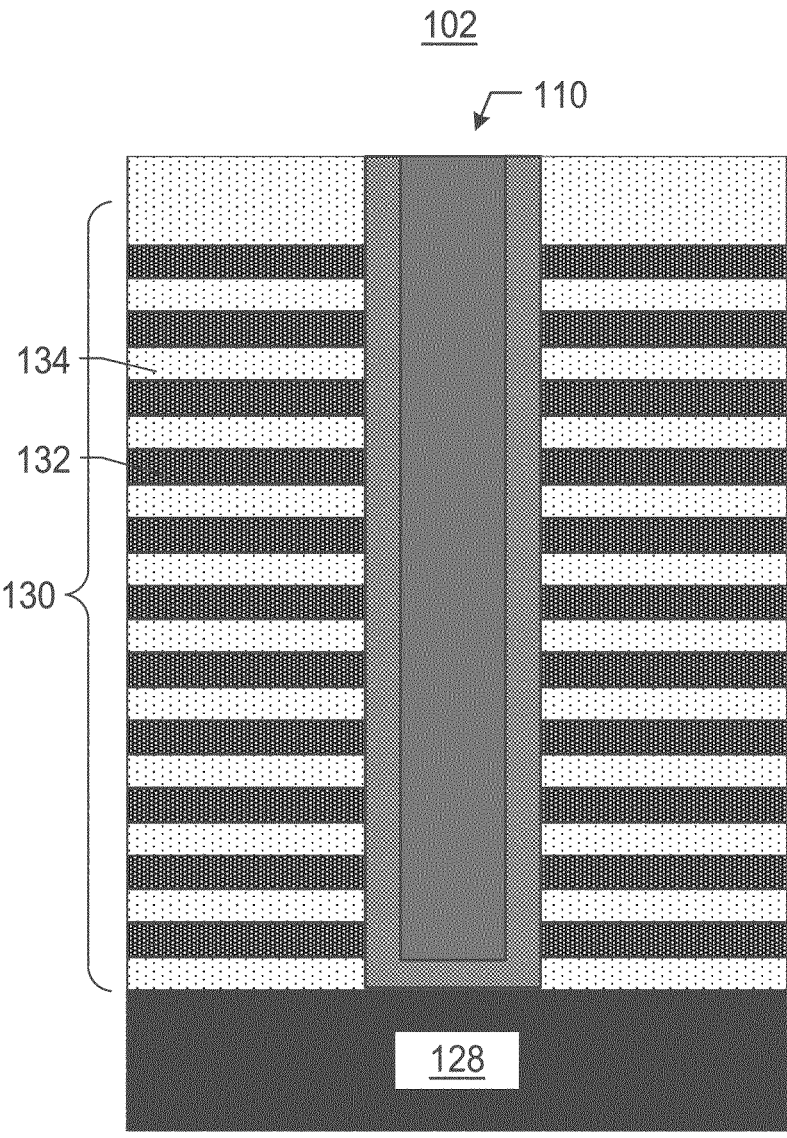
FIG. 4 is a schematic cross-sectional view of an array of memory cells including memory strings provided by an example of the present disclosure.

Referring to FIG. 4, FIG. 4 is a schematic cross-sectional view of an array of memory cells including memory strings provided by an example of the present disclosure. As shown in FIG. 4, the memory string 110 may extend vertically above the substrate 128 through the stacked memory layers 130. The substrate 128 may include silicon (e.g., Monocrystalline Silicon), Silicon Germanium (SiGe), Gallium Arsenide (GaAs), Germanium (Ge), Silicon-On-Insulator (SOI), Germanium-On-Insulator (GOI), or any other appropriate material.

The stacked memory layer 130 may include alternating gate conductive layers 132 and gate dielectric layers 134. The number of pairs of gate conductive layers 132 and gate dielectric layers 134 in the stacked memory layer 130 may determine the number of memory cells 108 in the array of memory cells 102. The gate conductive layer 132 may include conductive materials including but not limited to tungsten (W), cobalt (Co), copper (Cu), aluminum (Al), polysilicon, doped silicon, silicide or any combination thereof. In some examples, each gate conductive layer 132 includes a metal layer, e.g., a tungsten layer. In some examples, each gate conductive layer 132 includes a doped polysilicon layer. Each gate conductive layer 132 may include a control gate surrounding the memory cell 108 and may extend laterally at the top of the stacked memory layer 130 as a Drain Selective Line 120, extend laterally at the bottom of the stacked memory layer 130 as a Source Selective Line 118, or extend laterally between the Drain Selective Line 120 and the Source Selective Line 118 as a word line 124.

As shown in FIG. 4, memory string 110 includes a channel structure extending vertically through stacked memory layer 130. In some examples, a channel structure includes a channel hole filled with semiconductor material(s) (e.g., as a semiconductor channel) and dielectric material(s) (e.g., as a memory film). In some examples, a semiconductor channel includes silicon, e.g., polysilicon. In some examples, a memory film includes a composite dielectric layer including a tunneling layer, a storage layer (also referred to as a "charge trapping/storage layer"), and a blocking layer. A channel structure may be in a cylindrical shape (e.g., a pillar shape). According to some examples, a semiconductor channel, a tunneling layer, a storage layer and a blocking layer are radially arranged in this sequence from the center of the pillar toward the outer surface of the pillar. A tunneling layer may include silicon oxide, silicon oxynitride, or any combination thereof. A storage layer may include silicon nitride, silicon oxynitride, or any combination thereof. A blocking layer may include silicon oxide, silicon oxynitride, a high-k (high-k) dielectric, or any combination thereof. In an example, a memory film may include a composite layer of silicon oxide/silicon oxynitride/silicon oxide (ONO).

According to some examples, a well (e.g., a P-well and/or an N-well) may be formed in the substrate 128, and the source terminal of the memory string 110 contacts the well. For example, a source line may be coupled to the well to apply an erase voltage to the well (e.g., the source of the memory string) during an erase operation. In some examples, the memory string further includes a channel plug at the drain terminal of the memory string 110. Although not shown in FIG. 4, additional components of the array of memory cells 102 may be formed, the additional components including but not limited to gate line gaps/source contacts, local contacts, interconnection layers, etc.

Referring back to FIG. 3, peripheral circuit 104 may be coupled to the array of memory cells 102 through a bit line 122, a word line 124, a source line 116, a Source Selective Line 118, and a Drain Selective Line 120. Peripheral circuit 104 may include any suitable analog, digital, and mixed-signal circuit for facilitating operation of the array of memory cells 102 through applying and sensing a voltage signal and/or a current signal from or to each target memory cell 108 via the bit line 122, the word line 124, the source line 116, the Source Selective Line 118, and the Drain Selective Line 120. The peripheral circuit 104 may include various types of peripheral circuits formed with Metal Oxide Semiconductor (MOS) technology.

Figure 5:
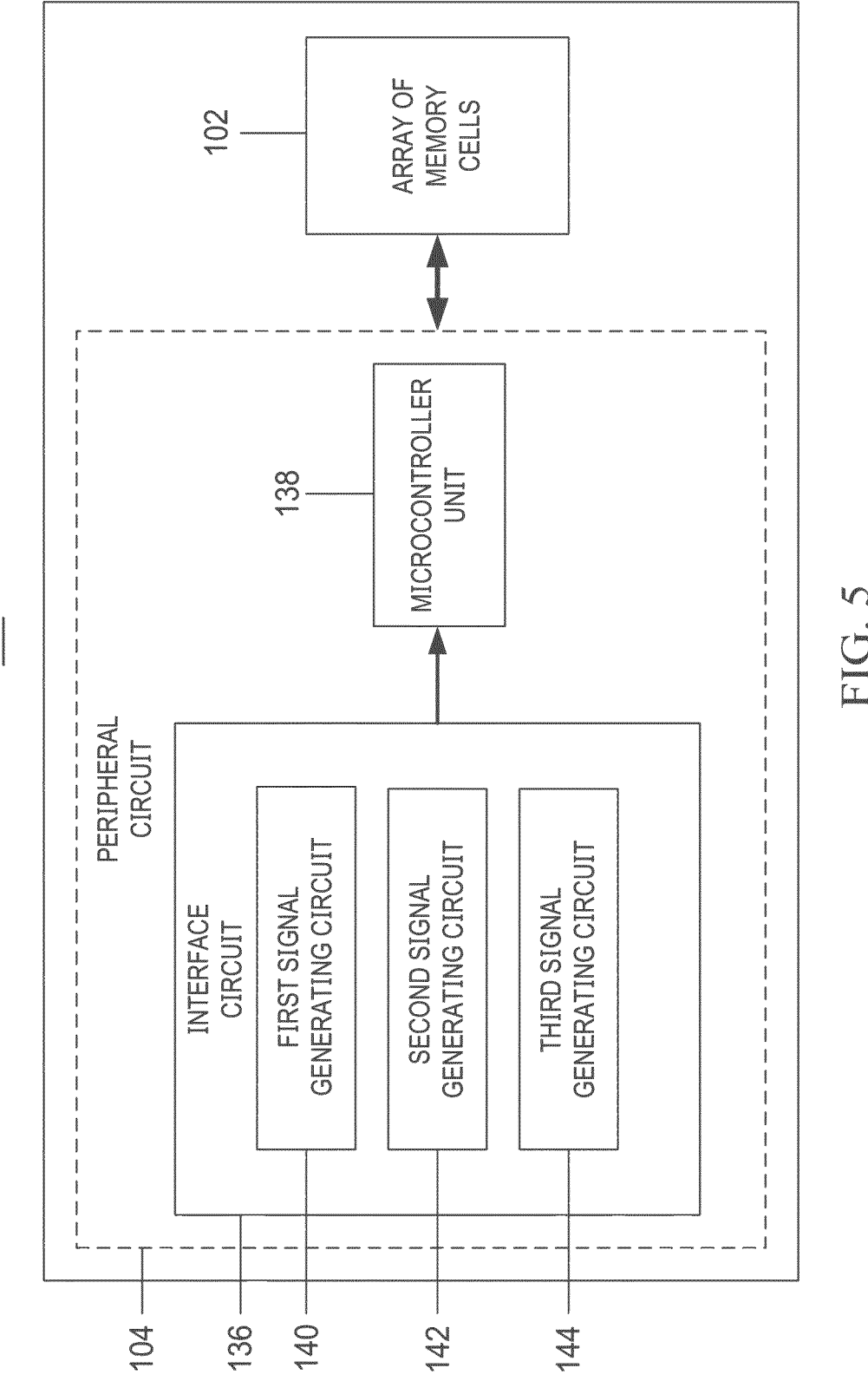
FIG. 5 is a second schematic diagram of a memory provided by an example of the present disclosure.

Referring to FIG. 5, FIG. 5 is a second schematic diagram of a memory provided by an example of the present disclosure. The process of performing program operations on the array of memory cells after three initialization operations will be described in detail below in conjunction with FIG. 5.

As shown in FIG. 5, an example of the present disclosure provides a memory 100. The memory 100 described above includes an array of memory cells 102 and a peripheral circuit 104 coupled to the array of memory cells 102. The peripheral circuit 104 includes an interface circuit 136 and a microcontroller unit 138, and the interface circuit 136 includes a first signal generating circuit 140, a second signal generating circuit 142 and a third signal generating circuit 144.

In an example of the present disclosure, in the case of performing three initialization operations, the three initialization operations include a first initialization operation, a second initialization operation and a third initialization operation. The first initialization operation is unrelated to the program address and the program data which correspond to the program operation. The second initialization operation is related to the program address corresponding to the program operation and unrelated to the program data corresponding to the program operation. The third initialization operation is related to the program data corresponding to the program operation.

In one example, the first initialization operation is unrelated to the program address and the program data which correspond to the program operation means that the first initialization operation may be performed without using the program address and program data which correspond to the program operation. For example, the first initialization operation may be started after the interface circuit receives the program command. In one example, the first initialization operation may include a temperature detection operation.

In one example, the second initialization operation is related to the program address corresponding to the program operation and unrelated to the program data corresponding to the program operation means that the second initialization operation may be performed with the program address corresponding to the program operation but without using the program data corresponding to the program operation. For example, the second initialization operation may be started after the interface circuit receives the program command and the program address. In one example, the second initialization operation may include a word line voltage bias operation and a bad block detection operation.

In one example, the third initialization operation is related to the program data corresponding to the program operation means that the third initialization operation may be performed with the program data corresponding to the program operation. For example, the third initialization operation may be started after the interface circuit receives the program command, the program address, the program data and the program confirmation command. In one example, the third initialization operation may include data preprocessing, data transmission, etc.

In some examples, in the case of performing three initialization operations, the three initialization operations may include a first initialization operation, a second initialization operation and a third initialization operation, and the first initialization operation is unrelated to the program address and the program data which correspond to the program operation. The interface circuit 136 is configured to: receive a program command and a program address which correspond to a program operation. The first signal generating circuit 140 is configured to: send a first initialization operation signal to the microcontroller unit 138 after the interface circuit 136 receiving a program command corresponding to a program operation. The microcontroller unit 138 is configured to: receive the first initialization operation signal, and perform a first initialization operation. The process of receiving the program address corresponding to the program operation and the process of performing the first initialization operation are performed in parallel.

As shown in FIG. 5, the interface circuit 136 may trigger the first signal generating circuit 140 to generate the first initialization operation signal after receiving the program command corresponding to the program operation, and the first signal generating circuit 140 sends the first initialization operation signal to the microcontroller unit 138. The microcontroller unit 138 receives the first initialization operation signal and performs the first initialization operation. The process of the interface circuit 136 receiving the program address corresponding to the program operation and the process of the microcontroller unit 138 performing the first initialization operation overlap in time.

In some examples, the second initialization operation is related to the program address corresponding to the program operation and unrelated to the program data corresponding to the program operation.

The interface circuit 136 is further configured to: receive a program address and program data which correspond to a program operation.

The second signal generating circuit 142 is configured to: send a second initialization operation signal to the microcontroller unit 138 after the interface circuit 136 receives a program address corresponding to a program operation.

The microcontroller unit 138 is further configured to: receive the second initialization operation signal, and perform a second initialization operation. The process of receiving the program data corresponding to the program operation and the process of performing the second initialization operation are performed in parallel.

As shown in FIG. 5, the interface circuit 136 may trigger the second signal generating circuit 142 to generate the second initialization operation signal after receiving the program address corresponding to the program operation, and the second signal generating circuit 142 sends the second initialization operation signal to the microcontroller unit 138. The microcontroller unit 138 receives the second initialization operation signal and performs the second initialization operation. The process of the interface circuit 136 receiving the program data corresponding to the program operation and the process of the microcontroller unit 138 performing the second initialization operation overlap in time.

In some examples, the third initialization operation is related to the program data corresponding to the program operation. The interface circuit 136 is further configured to:

receive program data and a program confirmation command which correspond to the program operation. The third signal generating circuit 144 is configured to: send a third initialization operation signal to the microcontroller unit 138 after the interface circuit 136 receives a program confirmation command. The microcontroller unit 138 is further configured to: receive the third initialization operation signal, and perform a third initialization operation.

As shown in FIG. 5, the interface circuit 136 may trigger the third signal generating circuit 144 to generate the second initialization operation signal after receiving the program confirmation command corresponding to the program operation, and the third signal generating circuit 144 sends the third initialization operation signal to the microcontroller unit 138. The microcontroller unit 138 receives the third initialization operation signal and performs a third initialization operation. A program-verify operation may be performed after the first initialization operation, the second initialization operation, and the third initialization operation is completed.

The process of the microcontroller unit 138 performing the first initialization operation and the process of the interface circuit 136 receiving the program address corresponding to the program operation may overlap in time. The process of the microcontroller unit 138 performing the second initialization operation and the process of the interface circuit 136 receiving the program data corresponding to the program operation may overlap in time. The program-verify operation may be performed after the microcontroller unit 138 performs the third initialization operation. In this way, the process of performing the first initialization operation and the second initialization operation by the microcontroller unit and the process of the interface circuit receiving the program address and program data which correspond to the program operation are performed in parallel, which may effectively reduce the time for the microcontroller unit to perform the initialization operation before performing the program-verify operation. In a further example, the time length for performing the initialization operation by the microcontroller unit is reduced from the sum of the time length for performing the first initialization operation, the second initialization operation and the third initialization operation to the time length for performing the third initialization operation. Therefore, the impact of the initialization operation on the program time may be improved, thereby the program performance is improved.

In some examples, the microcontroller unit 138 includes a clock signal circuit. The clock signal circuit is configured to output a transition of the clock signal during each of the processes of performing the first initialization operation, the second initialization operation and the third initialization operation by the microcontroller unit 138.

The microcontroller unit 138 may operate based on a clock signal circuit that may output a clock signal, output a transition in the clock signal in response to a clock enable signal, and disable outputting a transition in the clock signal in response to a clock disable signal. Wherein, the transition of the clock signal refers to a process in which the clock signal switches from a low level state to a high level state, and switches from a high level state to a low level state.

In one example, during each of the processes of performing the first initialization operation, the second initialization operation and the third initialization operation by the microcontroller unit 138, the clock signal circuit may output the transition of the clock signal. In addition, during the process of performing the program-verify operation by the microcontroller unit 138, the clock signal circuit may also output the transition of the clock signal. Accordingly, during the process of the interface circuit 136 receiving the program address corresponding to the program operation, the microcontroller unit 138 performs the first initialization operation, and at this point, the clock signal circuit outputs a transition of the clock signal. During the process of the interface circuit 136 receiving the program data corresponding to the program operation, the microcontroller unit 138 performs the second initialization operation, and at this point, the clock signal circuit outputs a transition of the clock signal. The microcontroller unit 138 performs a third initialization operation and a program-verify operation after the interface circuit receives the program confirmation command corresponding to the program operation, and at this point, the clock signal circuit outputs a transition of the clock signal.

Figure 6:
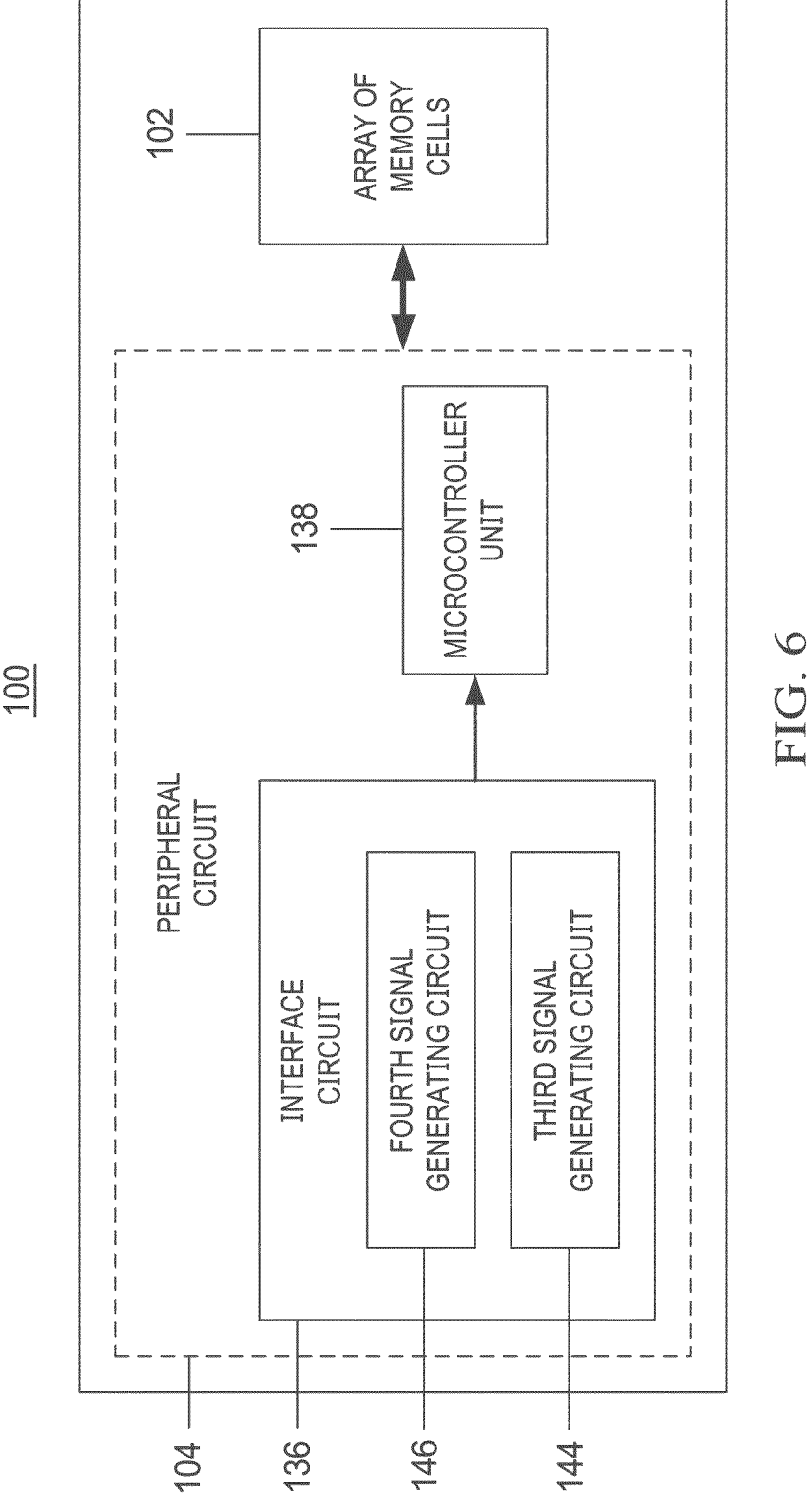
FIG. 6 is a third schematic diagram of a memory provided by an example of the present disclosure.
Figure 7:
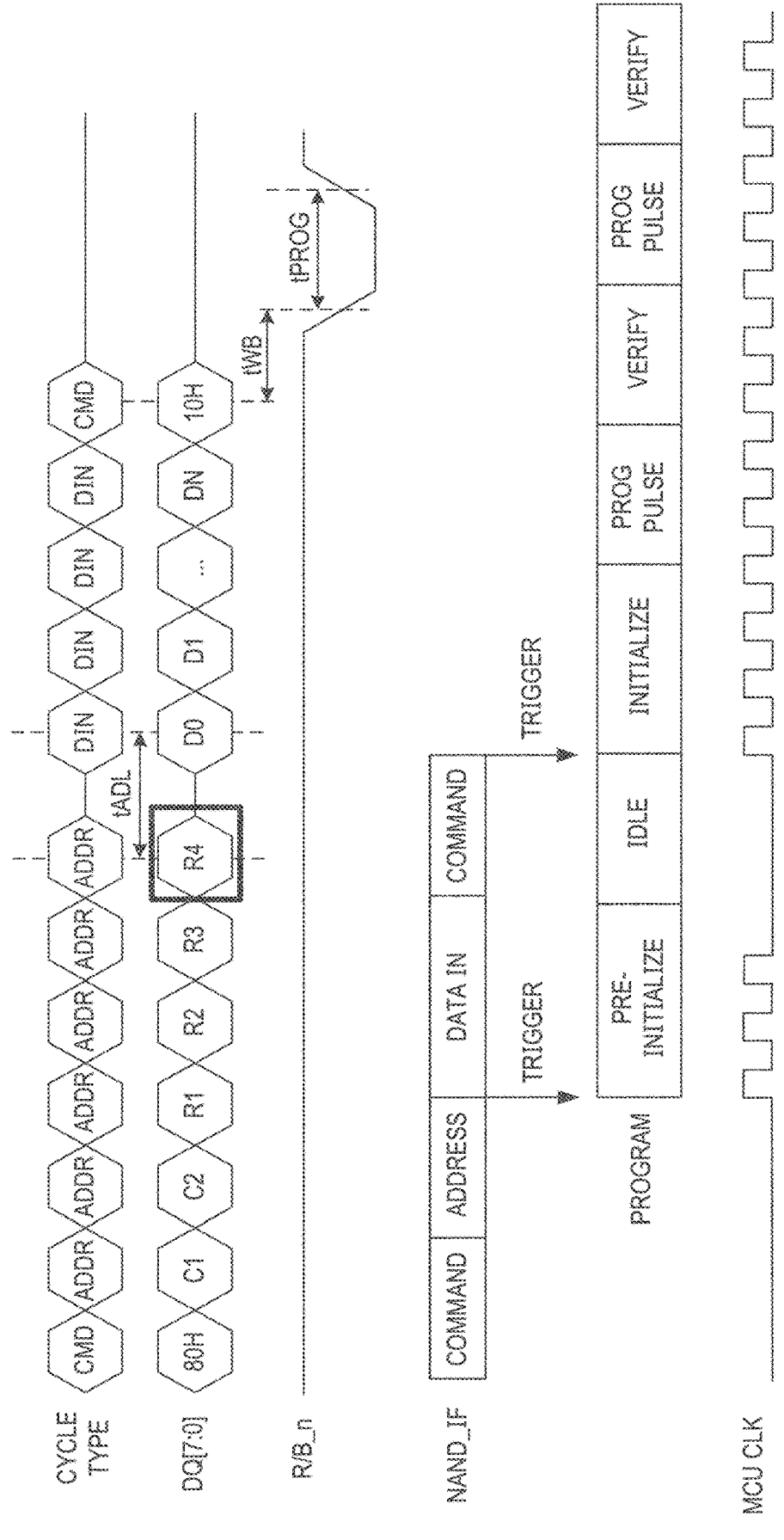
FIG. 7 is a timing diagram of a method for operating a memory provided by an example of the present disclosure.

Referring to FIG. 6, FIG. 6 is a third schematic diagram of a memory provided by an example of the present disclosure. Referring to FIG. 7, FIG. 7 is a timing diagram of a method for operating a memory provided by an example of the present disclosure. The process of performing program operations on the array of memory cells after two initialization operations will be described in detail below in conjunction with FIGS. 6 and 7.

As shown in FIG. 6, an example of the present disclosure provides a memory 100. The memory 100 described above includes an array of memory cells 102 and a peripheral circuit 104 coupled to the array of memory cells 102. The peripheral circuit 104 includes an interface circuit 136 and a microcontroller unit 138, and the interface circuit 136 includes a fourth signal generating circuit 146 and a third signal generating circuit 144.

In an example of the present disclosure, in the case of performing two initialization operations, the two initialization operations may include a fourth initialization operation and a third initialization operation. The fourth initialization operation is unrelated to the program data corresponding to the program operation. The third initialization operation is unrelated to the program data corresponding to the program operation.

In one example, the fourth initialization operation is unrelated to the program data corresponding to the program operation means that the fourth initialization operation may be performed with the program address corresponding to the program operation but without using the program data corresponding to the program operation. For example, the fourth initialization operation may be started after the interface circuit receives the program command and the program address. The fourth initialization operation includes the first initialization operation that is unrelated to the program address and the program data which correspond to the program operation; and the second initialization operation that is related to the program address corresponding to the program operation and unrelated to the program data corresponding to the program operation. In one example, the fourth initialization operation includes a temperature detection operation, a word line voltage bias operation and a bad block detection operation.

In one example, the third initialization operation is related to the program data corresponding to the program operation means that the third initialization operation may be performed with the program data corresponding to the program operation. For example, the third initialization operation may be started after the interface circuit receives the program command, the program address, the program data and the program confirmation command. In one example, the third initialization operation may include data preprocessing, data transmission, etc.

In some examples, in the case of performing two initialization operations, the two initialization operations may include a fourth initialization operation and a third initialization operation, and the fourth initialization operation is unrelated to the program data corresponding to the program operation. The interface circuit 136 is configured to: receive a program command, a program address and program data which correspond to a program operation. The fourth signal generating circuit 146 is configured to: send a fourth initialization operation signal to the microcontroller unit 138 after the interface circuit 136 receiving a program address corresponding to a program operation.

The microcontroller unit 138 is configured to: receive a fourth initialization operation signal, and perform a fourth initialization operation. The process of receiving the program data corresponding to the program operation and the process of performing the fourth initialization operation are performed in parallel.

As shown in FIG. 6, the interface circuit 136 may trigger the fourth signal generating circuit 146 to generate the fourth initialization operation signal after receiving the program command and the program address which correspond to the program operation, and the fourth signal generating circuit 146 sends the fourth initialization operation signal to the microcontroller unit 138. The microcontroller unit 138 receives the fourth initialization operation signal and performs the fourth initialization operation ("pre-initialize" as shown in FIG. 7). The process of the interface circuit 136 receiving the program data corresponding to the program operation and the process of the microcontroller unit 138 performing the fourth initialization operation overlap in time.

FIG. 7 illustrates that the interface circuit (e.g., NAND_IF) triggers the generation of the fourth initialization operation signal after receiving the row address R4, and the microcontroller unit 138 receives the fourth initialization operation signal and performs the fourth initialization operation. Meanwhile, the interface circuit 136 continues to receive program data corresponding to the program operation. Since it takes a long time for the interface circuit 136 to receive the program data corresponding to the program operation, the microcontroller unit 138 enters an idle state after performing the fourth initialization operation to wait for the completion of the input process of the program data.

In some examples, the third initialization operation is related to the program data corresponding to the program operation. The interface circuit 136 is further configured to: receive program data and a program confirmation command which correspond to the program operation. The third signal generating circuit 144 is configured to: send a third initialization operation signal to the microcontroller unit 138 after the interface circuit 136 receives a program confirmation command. The microcontroller unit 138 is further configured to: receive the third initialization operation signal, and perform a third initialization operation.

As shown in FIGS. 6 and 7, the interface circuit 136 may trigger the third signal generating circuit 144 to generate the second initialization operation signal after receiving the program confirmation command corresponding to the program operation, and the third signal generating circuit 144 sends the third initialization operation signal to the microcontroller unit 138. The microcontroller unit 138 receives the third initialization operation signal, and performs a third initialization operation (e.g., "initialize" as shown in FIG. 7). A program-verify operation may be performed after the fourth initialization operation and the third initialization operation is completed.

The process of the microcontroller unit 138 performing the fourth initialization operation and the process of the interface circuit 136 receiving the program data corresponding to the program operation overlap in time, and the program-verify operation may be performed after the microcontroller unit 138 performs the third initialization operation. In this way, the process of performing the fourth initialization operation by the microcontroller unit 138 and the process of the interface circuit 136 receiving the program data corresponding to the program operation are performed in parallel, which may effectively reduce the time for the microcontroller unit 138 to perform the initialization operation before performing the program-verify operation. In a further example, the time length for performing the initialization operation by the microcontroller unit 138 is reduced from the sum of the time length for the fourth initialization operation and the third initialization operation to the time length for the third initialization operation. Therefore, the impact of the initialization operation on the program time may be improved, thereby the program performance is improved.

In some examples, the microcontroller unit 138 includes a clock signal circuit; the clock signal circuit is configured to output a transition of the clock signal during each of the processes of performing the fourth initialization operation and the third initialization operation by the microcontroller unit 138.

As shown in FIG. 7, during each of the processes of performing the fourth initialization operation and the third initialization operation by the microcontroller unit 138, the clock signal circuit (e.g., MCU CLK) may output the transition of the clock signal. In addition, during the program-verify operation by the microcontroller unit, the clock signal circuit may also output the transition of the clock signal. Accordingly, during the process of the interface circuit 136 receiving the program data corresponding to the program operation, the microcontroller unit 138 performs the fourth initialization operation, and at this point, the clock signal circuit outputs a transition of the clock signal. The microcontroller unit 138 performs a third initialization operation and a program-verify operation after the interface circuit receives the program confirmation command corresponding to the program operation, and at this point, the clock signal circuit outputs a transition of the clock signal.

In some examples, the part of the program which is unrelated to the user program data may be transferred to the preprocessing subprogram, e.g., in the process of the interface circuit receiving the program data corresponding to the program operation, the microcontroller unit performs the fourth initialization operation, the fourth initialization operation mainly includes word line voltage bias, bad block detection, temperature detection and voltage/timing parameter calculation. The execution of the preprocessing subprogram (e.g., the fourth initialization operation) may be triggered to be performed after the user inputting the program address corresponding to the program operation, and the execution of the preprocessing subprogram and the input process of the program data corresponding to the user program operation may be performed in parallel, which may improve the impact of the time occupied by a part of initialization operations on program performance.

In an example of the present disclosure, a signal generating circuit is added to the interface circuit, and the timing and number of times of performing the initialization operation are changed. In the case of three initialization operations, the microcontroller unit may perform the first initialization operation and the second initialization operation respectively during the process of the interface circuit receiving the program address and program data which correspond to the program operation. The microcontroller unit 138 performs a third initialization operation after the interface circuit receives the program confirmation command. In the case of two initialization operations, the microcontroller unit 138 may perform the fourth initialization operation during the process of the interface circuit receiving the program data corresponding to the program operation. The microcontroller unit 138 performs a third initialization operation after the interface circuit receives the program confirmation command. In this way, the program performance of the memory may be optimized without significantly increasing the area and cost of the memory chip.

In addition, whether to use the method for operating the memory provided by an example of the present disclosure may be detected for the performing timing of the initialization operation.

In one example, during the process of the interface circuit 136 receiving the program address and program data which correspond to the program operation, whether to use the method for operating the memory provided by an example of the present disclosure may be determined by detecting whether the clock signal circuit of the microcontroller unit 138 outputs a transition of the clock signal. If during each of the processes of the interface circuit 136 receiving the program address and program data which correspond to the program operation, the transition of the clock signal output by the clock signal circuit of the microcontroller unit 138 may be detected. In an example, this indicates that the microcontroller unit 138 is performing the first initialization operation and the second initialization operate. If during the process of the interface circuit 136 receiving the program data corresponding to the program operation, the transition of the clock signal output by the clock signal circuit of the microcontroller unit may be detected. In an example, this indicates that the microcontroller unit 138 is performing the fourth initialization operation.

Similarly, during the process of the interface circuit 136 receiving the program address and program data which correspond to the program operation, whether to use the memory and operating method thereof provided by the examples of the present disclosure may be determined by detecting whether the register of the microcontroller unit 138 is flipped. Through the transition of the clock signal output by the clock signal circuit and the flip of the register, the related voltage/timing parameters are calculated, and in one example, the calculation of voltage/sequence parameters may be flexibly selected according to the actual situation, and will not be repeated here.

In one example, although the bias voltage is not directly transmitted to the word line in the word line bias voltage operation, the word line bias voltage is transmitted to an array of bias switch. During the process of the interface circuit 136 receiving the program data corresponding to the program operation, whether to use the method of operating the memory provided by the examples of the present disclosure may be determined by detecting the voltage fluctuation of the array of bias switch. If during the process of the interface circuit 136 receiving the program data corresponding to the program operation, the voltage of the array of bias switch may be detected (e.g., the array of bias switch is turned on). In an example, this indicates that the microcontroller unit 138 is performing the second initialization operation or the fourth initialization operate.

In one example, the bad blocks exist in the latches of the row decoders connected to the word lines, "1" is stored in the latches detected as bad blocks, and "0" is stored in the latches detected as not bad blocks. During the process of the interface circuit 136 receiving the program data corresponding to the program operation, whether to use the method for operating the memory provided by the examples of the present disclosure may be determined by detecting the readout signal of the latch. If during the process of the interface circuit 136 receiving the program data corresponding to the program operation, it may be detected that the readout signal of the latch is "1"; this indicates that the microcontroller unit 138 has performed the second initialization operation or the fourth initialization operation, and the result of the bad block detection operation is stored in the latch.

In one example, during the process of the interface circuit 136 receiving the program command, the program address and the program data which correspond to the program operation, once the process of the interface circuit 136 receiving the program data corresponding to the program operation finishes, a reset command is immediately sent to read the temperature of the temperature sensor. The temperature sensor temperature read at this time is compared with the sensor temperature which is read before the interface circuit 136 receives the program command corresponding to the program operation, and if two readings of the sensor temperatures change, it indicates that the temperature detection has already been performed during the process of the interface circuit 136 receiving the program command, the program address and the program data which correspond to the program operation (e.g., the first initialization operation or the fourth initialization operation).

In addition, the position of the MCU may be determined through observing the positions of structures such as Static Random Access Memory (SRAM) and Read-Only Memory (ROM) on the layout. The array of bias switch has a large number of repeated structures, and the position of the array of bias switch may also be found through observing on the layout.

Figure 8:
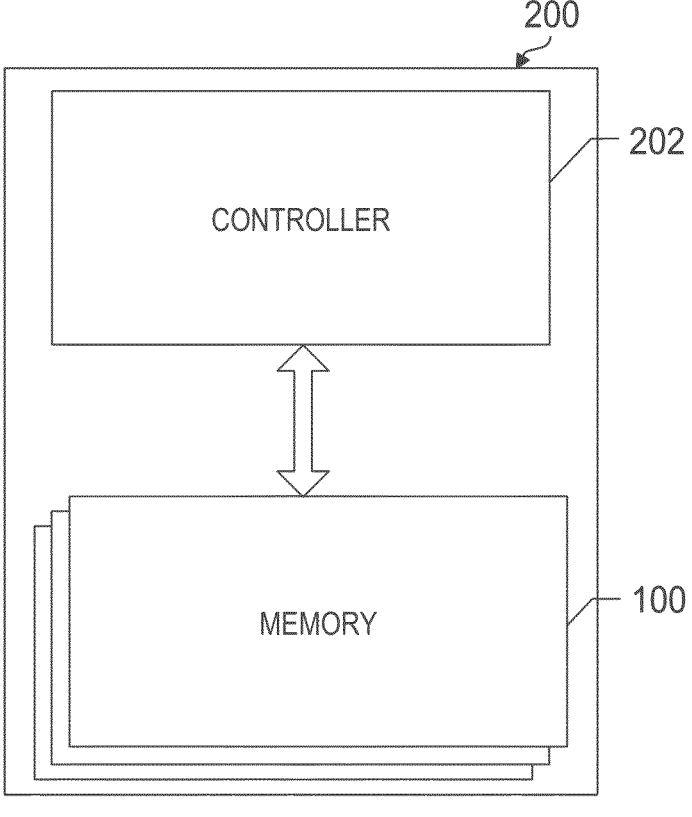
FIG. 8 is a schematic diagram of a memory system provided by an example of the present disclosure.

Referring to FIG. 8, FIG. 8 is a schematic diagram of a memory system provided by an example of the present disclosure. As shown in FIG. 8, an example of the present disclosure provides a memory system. The memory system 200 described above includes: at least one memory 100 as described in the above examples, and a controller 202 coupled to the memory 100 and configured to control the memory 100.

In some examples, the controller 202 is designed to operate in low duty cycle environments, e.g., Secure Digital (SD) card, Compact Flash (CF) card, Universal Serial Bus (USB) flash drive, or other media for use in electronic devices such as personal computer, digital camera, mobile phone, etc.

In some examples, the controller 202 is designed to operate in high duty cycle environments such as SSD or embedded Multi-Media Card (eMMC), where SSDs or eMMCs are used as data storage for mobile devices such as smartphone, tablet computer, laptop computer, and enterprise storage array.

The controller 202 may be configured to control operations of the memory 100, e.g., read, erase, and program operations. The controller 202 may be further configured to manage various functions related to data stored or to be stored in memory 100, including but not limited to bad block management, garbage collection, logical-to-physical address translation, wear leveling, etc. In some examples, the controller 202 is further configured to process error correction code (ECC) related to data read from or written to memory 100.

The controller 202 may also perform any other suitable functions, e.g., formatting memory 100. The controller 202 may communicate with external devices (e.g., host 302) according to a particular communication protocol. For example, the controller 202 may communicate with external devices through at least one of various interface protocols, such as USB protocol, MMC protocol, Peripheral Component Interconnect (PCI) protocol, PCI Express (PCI-E) protocol, Advanced Technology Attachment (ATA) protocol, Serial ATA protocol, Parallel ATA protocol, Small Computer System Interface (SCSI) protocol, Enhanced Small Drive Interface (ESDI) protocol, Integrated Drive Electronics (IDE) protocol, Fire wire protocol, etc.

The controller 202 and one or more memory 100 may be integrated into various types of storage devices, e.g., included in the same package (e.g., Universal Flash Storage (UFS) package or eMMC package). For example, memory system 200 may be implemented and packaged into different types of end electronic products.

Figure 9:
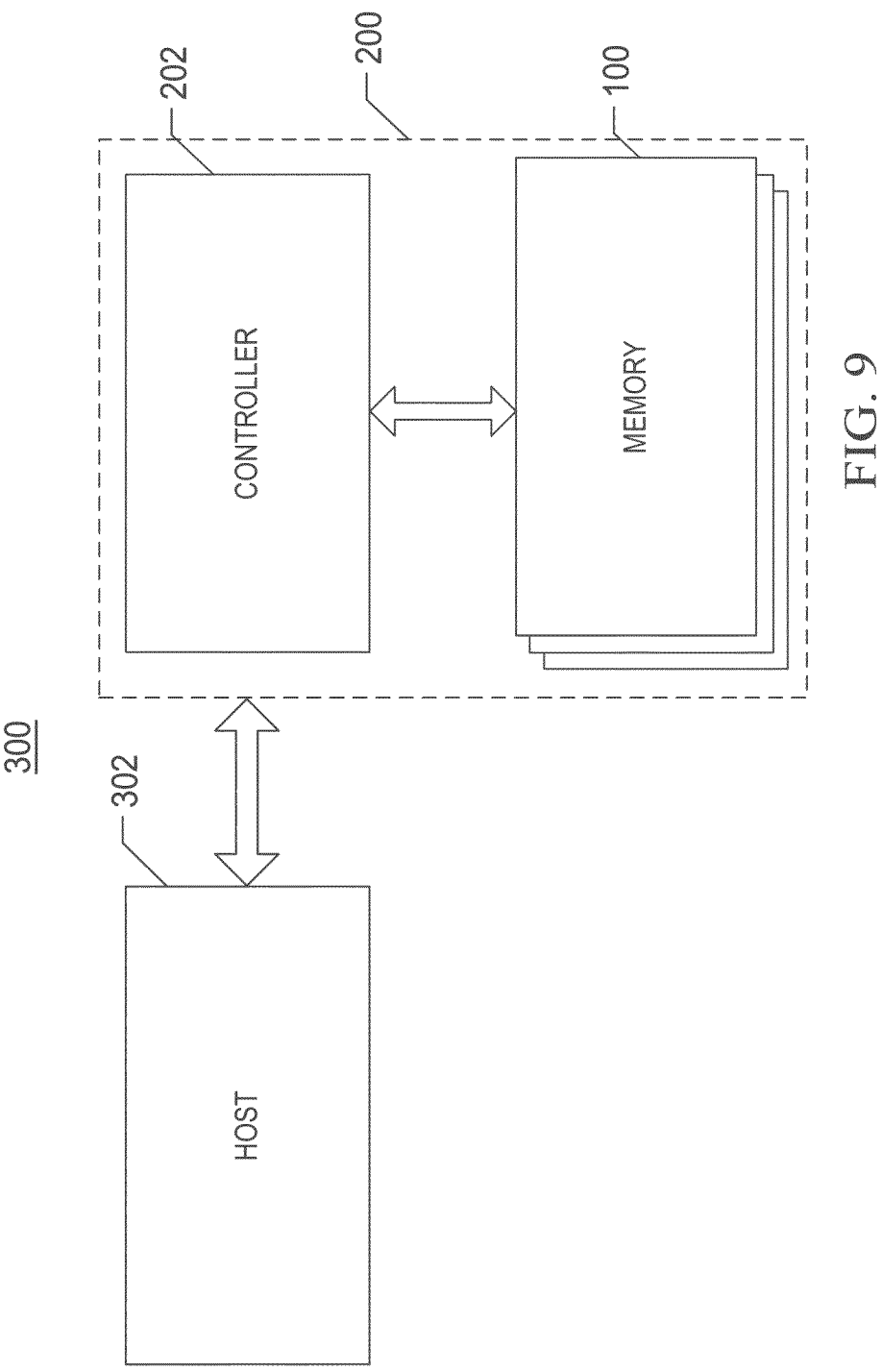
FIG. 9 is a schematic diagram of an electronic device provided by an example of the present disclosure.

Referring to FIG. 9, FIG. 9 is a schematic diagram of an electronic device provided by an example of the present disclosure. As shown in FIG. 9, an example of the present disclosure provides an electronic device 300. The electronic device 300 described above includes a memory system 200 as in the technical solution described above, and a host 302 coupled to the memory system 200.

In some examples, the electronic device 300 may be a mobile phone, a desktop computer, a laptop computer, a tablet, a vehicle computer, a gaming console, a printer, a positioning device, a wearable electronic device, a smart sensor, a Virtual Reality (VR) device, an Augmented Reality (AR) device, or any other suitable electronic devices having memory device therein.

As shown in in FIG. 9, the electronic device 300 may include a host 302 and a memory system 200, and the memory system 200 has one or more memory 100 and a memory controller 202. The host 302 may be a processor of an electronic device (e.g., a Central Processing Unit (CPU)) or a System on Chip (SoC) (e.g., an Application Processor (AP)). The host 302 may be configured to send data to or receive data from the memory 100.

In some examples, the memory controller 202 is coupled to the memory 100 and the host 302 and is configured to control the memory 100. The controller 202 may manage data stored in the memory 100 and communicate with the host 302.

Figure 10B:
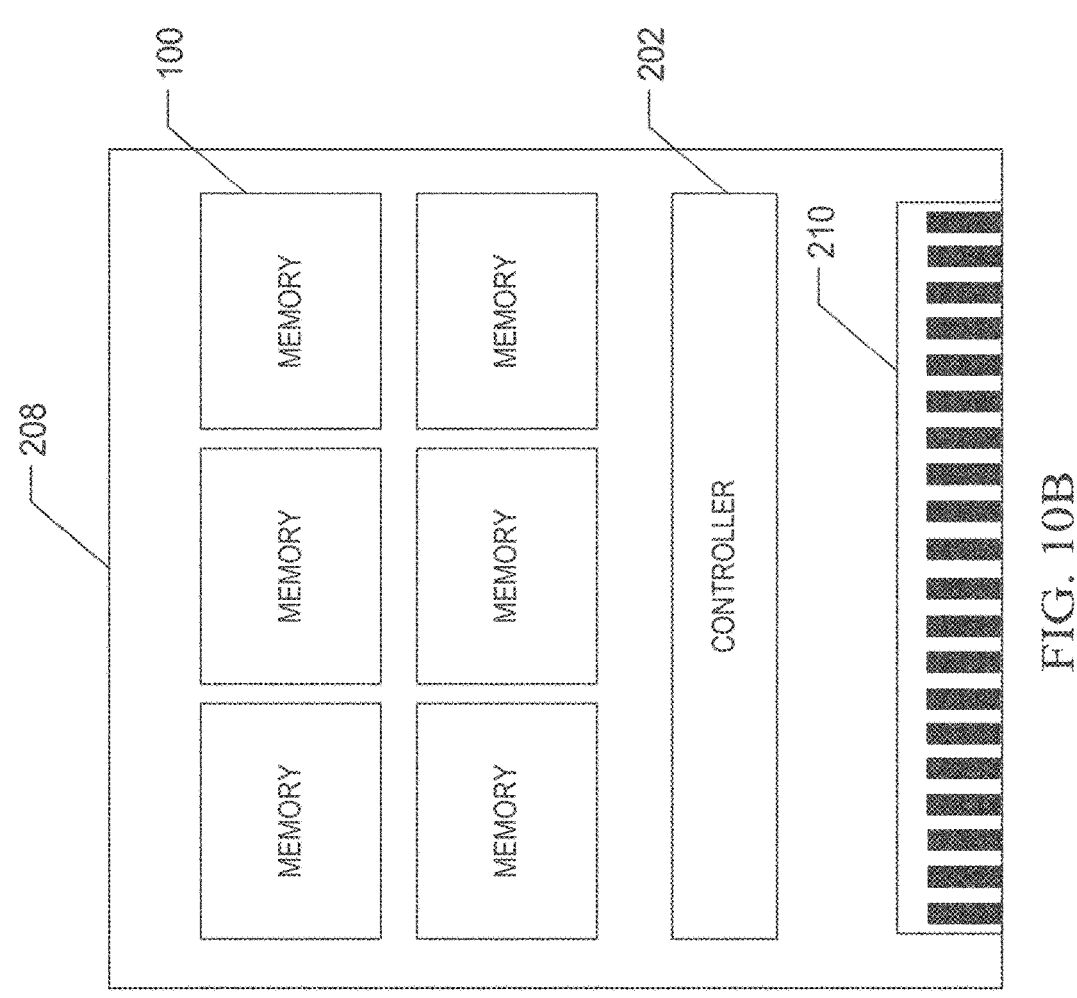
FIG. 10B is a schematic diagram of a solid state drive with a memory provided by an example of the present disclosure.
Figure 10A:
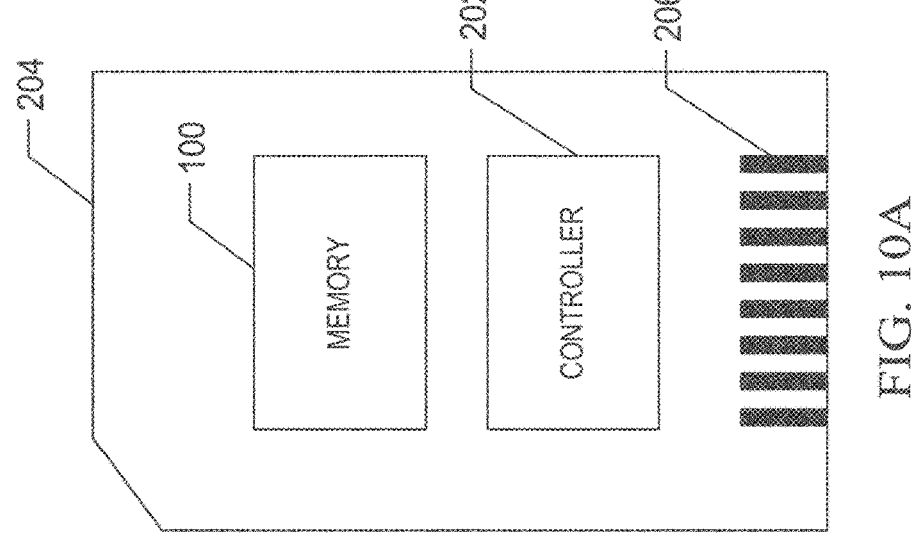
FIG. 10A is a schematic diagram of a memory card with a memory provided by an example of the present disclosure.

Referring to FIG. 10A, FIG. 10A is a schematic diagram of a memory card with a memory according to an example of the present disclosure. As shown in FIG. 10A, the controller 202 and a single memory 100 may be integrated into a memory card 204. The memory card 204 may include a Personal Computer Memory Card International Association (PCMCIA) card, a CF card, a Smart Media (SM) card, a memory stick, a Multimedia Card (e.g., MMC, Reduced-Size MMC (RS-MMC), Micro MMC (MMCmicro)), SD (e.g., SD, Mini SD (miniSD), Micro SD (microSD), High Capacity SD (Secure Digital High Capacity, SDHC)) card, UFS, etc. Memory card 204 may further include a memory card connector 24 coupling memory card 206 with a host (e.g., host 302 in FIG. 9).

Referring to FIG. 10B, FIG. 10B is a schematic diagram of a solid state drive with a memory according to an example of the present disclosure. As shown in FIG. 10B, the controller 202 and the multiple memories 100 may be integrated into the solid state drive 208. The solid state drive 208 may also include a solid state drive connector 210 that couples solid state drive 208 to a host (e.g., host 302 in FIG. 9). In some examples, the storage capacity and/or operating speed of the solid state drive 208 is greater than the storage capacity and/or operating speed of the memory card.

Referring to FIG. 11, FIG. 11 is a schematic flowchart of a method for operating a memory provided by an example of the present disclosure. As shown in FIG. 11, an example of the present disclosure provides a method for operating a memory, wherein the memory includes an array of memory cells and a peripheral circuit coupled to the array of memory cells; the method includes:

Operation S1101: receiving a program command, a program address, program data, and a program confirmation command which correspond to a program operation.

Operation S1102: performing the program operation on the array of memory cells after performing at least two initialization operations. The process of receiving the program command, the program address, the program data, and the program confirmation command which correspond to the program operation and the process of performing the at least two initialization operations at least partially overlap in time.

In an example of the present disclosure, the process of receiving the program command, the program address, the program data and the program confirmation command which correspond to the program operation and the process of performing at least two initialization operations at least partially overlap in time. The process of receiving the program command, the program address, the program data and the program confirmation command which correspond to the program operation and the process of performing a part of the initialization operations may be performed in parallel, in this way, the impact of the initialization operation on the program time may be improved, thereby program performance is improved.

In some examples, in the case of performing three initialization operations, the three initialization operations include a first initialization operation, a second initialization operation and a third initialization operation, and the first initialization operation is unrelated to the program address and the program data which correspond to the program operation. The peripheral circuit includes an interface circuit and a microcontroller unit, and the interface circuit includes a first signal generating circuit, a second signal generating circuit and a third signal generating circuit. The method includes: receiving, by the interface circuit, a program command corresponding to a program operation, sending, by the first signal generating circuit, a first initialization operation signal to the microcontroller unit after the interface circuit receiving a program command corresponding to a program operation, by the microcontroller unit, receiving the first initialization operation signal, and performing a first initialization operation. The process of receiving the program address corresponding to the program operation and the process of performing the first initialization operation are performed in parallel.

In some examples, the second initialization operation is related to the program address corresponding to the program operation and unrelated to the program data corresponding to the program operation.

After the interface circuit receives a program command corresponding to a program operation, the method further includes: receiving, by the interface circuit, a program address corresponding to a program operation, sending, by the second signal generating circuit, a second initialization operation signal to the microcontroller unit after the interface circuit receiving a program address corresponding to a program operation, by the microcontroller unit, receiving the second initialization operation signal, and performing a second initialization operation. The process of receiving the program data corresponding to the program operation and the process of performing the second initialization operation are performed in parallel.

In some examples, the third initialization operation is related to the program data corresponding to the program operation.

After the interface circuit receiving a program address corresponding to a program operation, the method further includes: receiving, by the interface circuit, program data and a program confirmation command which correspond to the program operation, sending, by the third signal generating circuit, a third initialization operation signal to the microcontroller unit after the interface circuit receiving a program confirmation command, receiving, further by the microcontroller unit, the third initialization operation signal and performing a third initialization operation.

In some examples, the microcontroller unit includes a clock signal circuit; and the method further includes: outputting, by the clock signal circuit, a transition of the clock signal during each of the processes of performing the first initialization operation, the second initialization operation and the third initialization operation by the microcontroller unit.

In some examples, in the case of performing two initialization operations, the two initialization operations include a fourth initialization operation and a third initialization operation, and the fourth initialization operation is unrelated to the program data corresponding to the program operation. The peripheral circuit includes an interface circuit and a microcontroller unit, and the interface circuit includes a fourth signal generating circuit and a third signal generating circuit. The method further includes: receiving, by the interface circuit, a program command and a program address which correspond to a program operation, sending, by the fourth signal generating circuit, a fourth initialization operation signal to the microcontroller unit after the interface circuit receiving a program address corresponding to a program operation, by the microcontroller unit, receiving a fourth initialization operation signal, and performing a fourth initialization operation. The process of receiving the program data corresponding to the program operation and the process of performing the fourth initialization operation are performed in parallel.

In some examples, the third initialization operation is related to the program data corresponding to the program operation.

After the interface circuit receiving a program command and a program address which correspond to a program operation, the method further includes: receiving, further by the interface circuit, program data and a program confirmation command which correspond to the program operation, sending, by the third signal generating circuit, a third initialization operation signal to the microcontroller unit after the interface circuit receiving a program confirmation command, receiving, by the microcontroller unit, the third initialization operation signal and performing a third initialization operation.

In some examples, the microcontroller unit includes a clock signal circuit, and the method further includes: outputting, by the clock signal circuit, a transition of the clock signal during each of the processes of performing the fourth initialization operation and the third initialization operation by the microcontroller unit.

An example of the present disclosure provides a readable storage medium having computer program stored thereon, that when executed, may implement the method for operating a memory of any one of the technical schemes described above.

In an example of the present disclosure, the computer-readable storage medium may include: Random Access Memory (RAM), memory, ROM, electrically programmable ROM, electrically erasable programmable ROM, registers, hard disk, removable disk, CD-ROM, or any other form of program code medium known in the art.

Examples of the present disclosure provide a memory and operating method thereof, a memory system and a readable storage medium. The memory includes an array of memory cells and a peripheral circuit coupled to the array of memory cells. The peripheral circuit is configured to: receive a program command, a program address, program data, and a program confirmation command corresponding to a program operation, and perform the program operation on the array of memory cells after performing at least two initialization operations. The process of receiving the program command, the program address, the program data, and the program confirmation command which correspond to the program operation and the process of performing the at least two initialization operations at least partially overlap in time. Compared with performing the initialization operation after receiving the program command, the program address, the program data and the program confirmation command which correspond to the program operation, in an example of the present disclosure, the process of receiving the program command, the program address, the program data and the program confirmation command which correspond to the program operation and the process of performing at least two initialization operations at least partially overlap in time. For example, the process of receiving the program command, the program address, the program data and the program confirmation command which correspond to the program operation and the process of performing a part of the initialization operations may be performed in parallel, in this way, the impact of the initialization operation on the program time may be improved, thereby program performance is improved.

Reference throughout the description to "one example" or "an example" means that a particular feature, structure or characteristic related to the example is included in at least one example of the present disclosure. Thus, appearances of "in one example" or "in an example" in various places throughout the description are not necessarily referring to a same example. Furthermore, these particular features, structures or characteristics may be combined in any appropriate manner in one or more examples. It should be understood that in various examples of the present disclosure, sequence numbers of the processes described above do not mean the execution order, and the execution order of each process should be determined by its function and internal logic, and should not constitute any limitation to illustrated process of examples of the present disclosure. The serial numbers of examples of the present disclosure described above are for the purpose of description only, and do not represent the advantages and disadvantages of the examples.

The above is only an example of the present disclosure, and does not limit the patent scope of the present disclosure, and under the inventive concept of the present disclosure, any equivalent structural transformation made by using content of the present disclosure and the accompanying drawings, or direct/indirect application in other related technical fields are included in the patent protection scope of the present disclosure.

What is claimed is:

1. A memory, comprising:

an array of memory cells; and a peripheral circuit, which is coupled to the array of memory cells and configured to:

receive a program command, a program address, program data, and a program confirmation command which correspond to a program operation; and perform the program operation on the array of memory cells after performing at least two initialization operations, wherein receiving the program command, the program address, the program data, and the program confirmation command which correspond to the program operation at least partially overlaps in time with performing the at least two initialization operations.

2. The memory of claim 1, wherein, in a case of performing three initialization operations, the three initialization operations include a first initialization operation unrelated to the program address and the program data which correspond to the program operation, a second initialization operation and a third initialization operation;

the peripheral circuit comprises:

an interface circuit, which is configured to receive the program command and the program address which correspond to the program operation, and wherein the interface circuit comprises:

a first signal generating circuit, which is configured to send a first initialization operation signal to a microcontroller unit after the interface circuit receiving the program command corresponding to the program operation, a second signal generating circuit, and a third signal generating circuit; and the microcontroller unit, which is configured to: receive the first initialization operation signal, and perform the first initialization operation, wherein the process of receiving the program address corresponding to the program operation and the process of performing the first initialization operation are performed in parallel.

3. The memory of claim 2, wherein the second initialization operation is related to the program address corresponding to the program operation and unrelated to the program data corresponding to the program operation;

the interface circuit is further configured to: receive the program address and the program data which correspond to the program operation;

the second signal generating circuit is configured to: send a second initialization operation signal to the microcontroller unit after the interface circuit receiving the program address corresponding to the program operation; and the microcontroller unit is further configured to: receive the second initialization operation signal, and perform the second initialization operation, wherein the process of receiving the program data corresponding to the program operation and the process of performing the second initialization operation are performed in parallel.

4. The memory of claim 3, wherein:

the first initialization operation includes a temperature detection operation; and the second initialization operation includes a word line voltage bias operation and a bad block detection operation.

5. The memory of claim 3, wherein the third initialization operation is related to the program data corresponding to the program operation;

the interface circuit is further configured to: receive the program data and the program confirmation command which correspond to the program operation;

the third signal generating circuit is configured to: send a third initialization operation signal to the microcontroller unit after the interface circuit receiving the program confirmation command; and the microcontroller unit is further configured to: receive the third initialization operation signal, and perform the third initialization operation.

6. The memory of claim 5, wherein the microcontroller unit includes a clock signal circuit, which is configured to:

output a transition of a clock signal during each of the processes of performing the first initialization operation, the second initialization operation and the third initialization operation by the microcontroller unit.

7. The memory of claim 1, wherein, in the case of performing two initialization operations, the two initialization operations include a fourth initialization operation unrelated to the program data corresponding to the program operation and a third initialization operation;

the peripheral circuit comprises:

an interface circuit, which is configured to: receive the program command, the program address and the program data which correspond to the program operation, and wherein the interface circuit comprises:

a fourth signal generating circuit, which is configured to send a fourth initialization operation signal to a microcontroller unit after the interface circuit receiving the program address corresponding to the program operation; and a third signal generating circuit; and the microcontroller unit, which is configured to receive the fourth initialization operation signal, and perform the fourth initialization operation, wherein the process of receiving the program data corresponding to the program operation and the process of performing the fourth initialization operation are performed in parallel.

8. The memory of claim 7, wherein the fourth initialization operation includes a temperature detection operation, a word line voltage bias operation and a bad block detection operation.

9. The memory of claim 7, wherein the third initialization operation is related to the program data corresponding to the program operation;

the interface circuit is further configured to: receive the program data and the program confirmation command which correspond to the program operation;

the third signal generating circuit is configured to: send a third initialization operation signal to the microcontroller unit after the interface circuit receiving the program confirmation command; and the microcontroller unit is further configured to: receive the third initialization operation signal, and perform the third initialization operation.

10. The memory of claim 9, wherein the microcontroller unit includes a clock signal circuit, which is configured to:

output a transition of a clock signal during each of the processes of performing the fourth initialization operation and the third initialization operation by the microcontroller unit.

11. A memory system, including:

at least one memory, comprising:

an array of memory cells; and a peripheral circuit, which is coupled to the array of memory cells and configured to:

receive a program command, a program address, program data, and a program confirmation command which correspond to a program operation; and perform the program operation on the array of memory cells after performing at least two initialization operations, wherein receiving the program command, the program address, the program data, and the program confirmation command which correspond to the program operation at least partially overlaps in time with performing the at least two initialization operations; and a controller coupled to the memory and configured to control the memory.

12. A method for operating a memory, wherein memory includes an array of memory cells and a peripheral circuit coupled to the array of memory cells, the method including:

receiving a program command, a program address, program data, and a program confirmation command which correspond to a program operation; and performing the program operation on the array of memory cells after performing at least two initialization operations, wherein the process of receiving the program command, the program address, the program data, and the program confirmation command which correspond to the program operation and the process of performing the at least two initialization operations at least partially overlap in time.

13. The method of claim 12, wherein, in the case of performing three initialization operations, the three initialization operations include a first initialization operation unrelated to the program address and the program data which correspond to the program operation, a second initialization operation and a third initialization operation;

the peripheral circuit includes:

an interface circuit, comprising: a first signal generating circuit, a second signal generating circuit and a third signal generating circuit; and a microcontroller unit;

the method includes:

receiving, by the interface circuit, the program command corresponding to the program operation;

sending, by the first signal generating circuit, a first initialization operation signal to the microcontroller unit after the interface circuit receiving the program command corresponding to the program operation; and by the microcontroller unit, receiving the first initialization operation signal, and performing the first initialization operation, wherein the process of receiving the program address corresponding to the program operation and the process of performing the first initialization operation are performed in parallel.

14. The method of claim 13, wherein the second initialization operation is related to the program address corresponding to the program operation and unrelated to the program data corresponding to the program operation;

after the interface circuit receiving a program command corresponding to the program operation, the method further includes:

receiving, by the interface circuit, the program address corresponding to the program operation;

sending, by the second signal generating circuit, a second initialization operation signal to the microcontroller unit after the interface circuit receiving the program address corresponding to the program operation; and by the microcontroller unit, receiving the second initialization operation signal, and performing the second initialization operation wherein the process of receiving the program data corresponding to the program operation and the process of performing the second initialization operation are performed in parallel.

15. The method of claim 14, wherein the third initialization operation is related to the program data corresponding to the program operation;

after the interface circuit receiving the program address corresponding to the program operation, the method further includes:

receiving, by the interface circuit, the program data and the program confirmation command which correspond to the program operation;

sending, by the third signal generating circuit, a third initialization operation signal to the microcontroller unit after the interface circuit receiving the program confirmation command; and receiving, further by the microcontroller unit, the third initialization operation signal, and perform the third initialization operation.

16. The method of claim 15, wherein the microcontroller unit includes a clock signal circuit, the method further including:

outputting, by the clock signal circuit, a transition of a clock signal during each of the processes of performing the first initialization operation, the second initialization operation and the third initialization operation by the microcontroller unit.

17. The method of claim 12, wherein, in the case of performing two initialization operations, the two initialization operations include a fourth initialization operation unrelated to the program data corresponding to the program operation and a third initialization operation;

the peripheral circuit includes:

an interface circuit, comprising a fourth signal generating circuit and a third signal generating circuit; and a microcontroller unit;

the method further includes:

receiving, by the interface circuit, the program command and the program address which correspond to the program operation;

sending, by the fourth signal generating circuit, a fourth initialization operation signal to the microcontroller unit after the interface circuit receiving the program address corresponding to the program operation; and by the microcontroller unit, receiving the fourth initialization operation signal, and performing the fourth initialization operation, wherein the process of receiving the program data corresponding to the program operation and the process of performing the fourth initialization operation are performed in parallel.

18. The method of claim 17, wherein the third initialization operation is related to the program data corresponding to the program operation;

after the interface circuit receiving the program command and the program address which correspond to the program operation, the method further includes:

receiving, further by the interface circuit, the program data and the program confirmation command which correspond to the program operation;

sending, by the third signal generating circuit, a third initialization operation signal to the microcontroller unit after the interface circuit receiving the program confirmation command; and by the microcontroller unit, receiving the third initialization operation signal, and performing the third initialization operation.

19. The method of claim 18, wherein the microcontroller unit includes a clock signal circuit, the method further including:

outputting, by the clock signal circuit, a transition of the clock signal during each of the processes of performing the fourth initialization operation and the third initialization operation by the microcontroller unit.

20. A non-transitory readable storage medium having computer program stored thereon that when executed, may implement a method for operating a memory, wherein the memory includes an array of memory cells and a peripheral circuit coupled to the array of memory cells, the method including:

receiving a program command, a program address, program data, and a program confirmation command which correspond to a program operation; and performing the program operation on the array of memory cells after performing at least two initialization operations, wherein receiving the program command, the program address, the program data, and the program confirmation command which correspond to the program operation at least partially overlaps in time with performing the at least two initialization operations.

* * * * *